(12) United States Patent
De Bruyker et al.

(10) Patent No.: US 8,291,823 B2
(45) Date of Patent: Oct. 23, 2012

(54) DIGITAL PRINTING PLATE AND SYSTEM WITH ELECTROSTATICALLY LATCHED DEFORMABLE MEMBRANES

(75) Inventors: Dirk De Bruyker, Palo Alto, CA (US); JengPing Lu, San Jose, CA (US); Jurgen H. Daniel, San Francisco, CA (US); Eugene M. Chow, Fremont, CA (US); Armin R. Volkel, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/957,113

(22) Filed: Nov. 30, 2010

(65) Prior Publication Data

US 2011/0107928 A1  May 12, 2011

Related U.S. Application Data

(62) Division of application No. 11/613,159, filed on Dec. 19, 2006, now Pat. No. 7,886,662.

(51) Int. Cl.
*B41F 3/36* (2006.01)
*B41F 9/00* (2006.01)
*B41N 1/00* (2006.01)
*B41M 1/00* (2006.01)
*B41M 1/10* (2006.01)

(52) U.S. Cl. .......................... 101/483; 101/153; 101/155

(58) Field of Classification Search .................. 101/154, 101/153, 375, 401.1, 401, 483; *B41F 3/36, B41F 9/00, 9/06*
See application file for complete search history.

(56) References Cited

U.S. PATENT DOCUMENTS

| 5,889,541 | A | * | 3/1999 | Bobrow et al. | 347/55 |
| 6,092,465 | A | * | 7/2000 | Agronin | 101/478 |
| 6,234,079 | B1 | * | 5/2001 | Chertkow | 101/395 |
| 2005/0134644 | A1 | * | 6/2005 | Pasch et al. | 347/44 |
| 2005/0155508 | A1 | * | 7/2005 | Vaidyanathan et al. | 101/489 |

FOREIGN PATENT DOCUMENTS

JP  2000335124 A  *  12/2000
WO  WO 02/051639 A2  *  7/2002

* cited by examiner

*Primary Examiner* — Daniel J Colilla
(74) *Attorney, Agent, or Firm* — Marger Johnson & McCollom PC

(57) ABSTRACT

A printing surface includes a substrate having latching electrodes on a first surface, a spacer layer on the first surface of the substrate, the spacer layer patterned to form wells such that the latching electrodes reside in the wells, a deformable membrane, the membrane having conductive regions, on the spacer layer to enclose the wells, each enclosed well and its associated region of the membrane forming a pixel membrane, and actuation circuitry to actuate the electrodes to cause selected ones of the pixel membranes to remain in a deflected state when the pixel membranes receive an impulse to return to an undeflected state.

7 Claims, 8 Drawing Sheets

DIGITAL PRINTING PLATE AND SYSTEM WITH ELECTROSTATICALLY LATCHED DEFORMABLE MEMBRANES

CROSS-REFERENCE TO RELATED APPLICATIONS

This is a Division of co-pending U.S. patent application Ser. No. 11/613,159, filed Dec. 19, 2006, entitled DIGITAL PRINTING PLATE AND SYSTEM WITH ELECTROSTATICALLY LATCHED DEFORMABLE MEMBRANES, the disclosure of which is herein incorporated by reference in its entirety.

RELATED APPLICATIONS

This application is related to the following co-pending US patent applications, and incorporated herein by reference in their entirety:

U.S. patent application Ser. No. 11/613,141, filed Dec. 19, 2006, entitled PRINTING SYSTEM EMPLOYING PHASE-CHANGING PRINTING PLATES, and U.S. patent application Ser. No. 11/613,152, filed Dec. 19, 2006, entitled PRINTING PLATE AND SYSTEM USING HEAT-DECOMPOSABLE POLYMERS.

BACKGROUND

Gravure, flexography and offset printing are high speed printing processes that result in high quality printed images. The high speed results from the 'stamping' nature of these processes, where a printing surface has areas such as wells in the case of gravure, raised features in flexography and ink accepting and repelling areas in offset printing that form the print image. After the inking process, the ink is transferred from the print image to a printing substrate. High quality prints may be achieved using high viscosity inks with high pigment loading and due to printing at high pixel (or ink dot) density.

In gravure printing, the printing surface such as a printing plate has wells formed in the areas needed to form the desired image. The surface receives the ink and a blade removes any excess, so that the ink is captured only in the wells. The system then applies a high contact pressure to the printing surface against a printing substrate to transfer the ink to the printing substrate. A printing substrate may include paper, transparency, foils, plastics, etc. Generally, due to the high contact pressure necessary, gravure printing processes print to paper or relatively sturdy substrates.

In flexographic printing, the process has many similar steps, except that the system raises the wells, or inked pixels, above the surface. Ink transfer occurs with less force, so the process can use 'softer' printing plates made out of rubber or other elastomers more appropriate for printing substrates or media other than paper, such as transparencies, foil, labels, plastic, etc.

Flexographic and gravure printing processes have relatively high costs. The cost of the system as well as the cost of manufacturing the printing surfaces, also referred to as masters or printing plates, result in these processes only being used for high volume printing applications. An ability to manufacture less expensive masters and a system to utilize them would allow more applications to take advantage of the high quality and high speed of flexographic and gravure printing.

SUMMARY

An embodiment is a printing surface having a substrate having latching electrodes on a first surface, a spacer layer on the first surface of the substrate, the spacer layer patterned to form wells such that the latching electrodes reside in the wells, a deformable membrane on the spacer layer over the wells, the membrane area above the well forming a pixel membrane, and actuation circuitry to address the electrodes to cause selected ones of the pixel membranes to remain in a deflected state when the pixel membranes receive an impulse to return to an undeflected state.

Another embodiment is a method of printing. The method includes moving an array of pixel membranes on a printing surface to a deflected position by an external force, causing selected ones of the pixel membranes to hold the deflected position while moving others of the pixel membranes to an undeflected position, applying ink to the printing surface, removing excess ink from the printing surface such that ink remains in deflected portions of the printing surface corresponding to the selected ones of the pixel membranes in the deflected positions, and applying the printing surface to a printing substrate.

DETAILED DESCRIPTION

Figure 1:
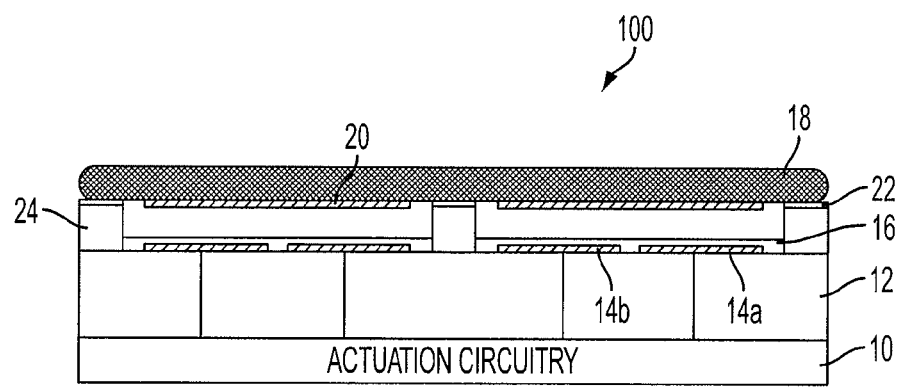
FIG. 1 shows an embodiment of a printing surface in an undeflected state.

FIG. 1 shows an embodiment of a printing plate 100 with electrostatic latching elements in an undeflected state. In either of the above examples, as well as many others, the term 'printing plate' means the component that has a surface upon which the print image is formed and is initially inked. For gravure printing, it may be a metal cylinder or a flat plate that is engraved with the recesses to capture ink, for flexography it may be a rubber cylinder or partial cylinder or a flat plate that has raised areas for accepting ink. In other applications, such as offset printing, the print image may be formed on the printing page by areas that accept ink and areas that do not. The term 'printing surface' refers to the surface of the printing plate that is manipulated to form the print image that ultimately transfers to the print media.

The ink may be a commonly used printing ink, including inks with color pigments or dye containing inks, UV curable inks; etc. The inks may also be used for patterning electronic circuits and they may have an electronic functionality, such as conductive inks, semiconductive inks, or inks containing precursors for conductive, semiconductive or insulating properties.

Figure 2:
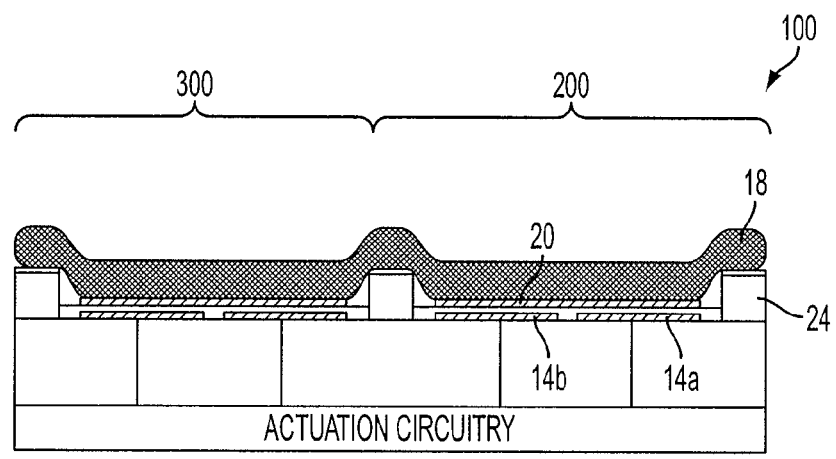
FIG. 2 shows an embodiment of a printing surface in a deflected state.

The printing plate may consist of a large number of identical cells that will be subsequently referred to as 'pixel membranes'. FIGS. 1 and 2 depict a cross-sectional view of two pixel membranes of plate 100. The printing plate has a substrate 10 that includes actuation circuitry 12 of some type, discussed later. The actuation circuitry connects to the latching electrodes, such as 14a and 14b. These electrodes may be identical and have the same surface area. On a single pixel membrane, the two electrodes form a series connection of two parallel plate capacitors in the presence of counter electrode 20. The counter electrode is the central node of this series connection and does not require electrical contacting. Alternatively, a single electrode can reside on the bottom substrate but in this case the counter electrode 20 on the membrane 18 does require an additional, external electrical contact.

A dielectric 16 deposited on top of the electrodes electrically insulates the electrodes. A spacer layer 24 formed of a patterned material provides an offset between the latching electrodes and the membrane 18. The membrane 18 may consist of a thin sheet of elastomer material, for instance a synthetic rubber such as Dupont's G-type Neoprene material (polychloroprene) or it may also consist of a silicone (PDMS) or a polyurethane, for example. The membrane 18 may have conductive regions on top or just below its surface, such as electrodes or implantation areas, or may have conductive properties. The membrane 18 in the example of FIG. 1 has a metal layer patterned to form electrodes such as 20. A bonding agent 22 bonds the membrane to the spacer layer.

Each region of the membrane having latching electrodes and being defined above a well by the spacer layer forms a pixel membrane such as 200 and 300. The pixel membranes may correspond to pixels on a printed image. To form an image on the printing plate, all pixel membranes are initially deflected and brought in contact with the substrate; selected pixel membranes are then retained in the deflected state using electrostatic forces to collect ink for subsequent transfer to a printing substrate.

FIG. 2 shows the pixel membranes in the deflected state. One can model the electrostatic latching technique that holds the pixel membranes in their deflected state. Large deflection models of thin film membranes can adequately describe thin elastomer membranes. An analysis has been done on the load deflection relation in these models, similar to what is discussed in *A Series Solution Approach to an Analytical Load-Deflection Relation for the Measurement of Mechanical Properties of Thin Films*," J. Micromech. Microeng. 9 (1999). The load deflection relation in these models typically takes on the following form:

$$p = \frac{C_1 \sigma w h}{R^2} + \frac{C_2 E w^3 h}{R^4},$$

where p is the pressure (load), σ the intrinsic film stress, w the deflection, h the film thickness, R the radius of the (circular) membrane, E the Young's modulus of the membrane material and C1 and C2 coefficients depending on its Poisson ratio (C1=4 and C2=2.8 for a Poisson ratio of about 0.3).

Note that elastomers are typically non-linear elastic materials, so for instance the Young's modulus is not constant over the range of deflection. However, reasonable estimates of stress and strain may be obtained by using this model with a constant value for E, using a value of about 0.01 GPa for the case of rubber, and the basic feasibility of the electrostatic latching for a practical pixel membrane design can be demonstrated.

For instance, if one considers pixel membranes of radius 21 μm corresponding to an image resolution of ~600 dpi, a well depth of 4 μm, and an elastomer thickness of 10 μm, the elastic restoring force of a deflected pixel membrane is equivalent to a pressure of $$p=2.8*0.01 \text{ GPa}*4^3*10/21^4=0.092 \text{ MPa}.$$

The electrostatic latching pressure on the other hand is given by:

$$p_{el}=F_{el}/A=\epsilon V^2/(2d^2)$$

where A is the area of electrodes 14a and 14b, ∈ the dielectric permittivity of the medium in-between the electrodes, V the applied voltage and d the thickness of the dielectric. The thickness of spacer 24 is assumed small compared to the width of the pixel membrane, so the capacitance between electrodes 14a and 14b can be adequately estimated using the parallel plate approach. Assuming the dielectric thickness to be 500 nm and its relative permittivity 7, typical for silicon nitride, then for an applied voltage of 100V the electrostatic pressure is $7*8.85E-12 \text{ F/m}*100V^2/(2*500 \text{ nm}^2)=1.2$ MPa. Hence for a voltage of 100V and given dimensions, the latching force exceeds the elastic force by an order of magnitude.

The breakdown field of the dielectric (Vmax/d) and its dielectric permittivity determine the maximum applicable electrostatic pressure. Either selecting a stronger dielectric, allowing an increase of the electrostatic pressure, or by making the elastomer membranes less stiff, such as by selecting a smaller elastomer thickness or a smaller displacement, can increase the ratio of latching force versus restoring force.

As an alternative method to achieve the latter, one could incorporate compressive intrinsic stress in the elastomer membrane. The subsequent negative stress term in the elastic load-deflection relation may compensate the bending stress and result in a membrane of lower stiffness. However, if the membrane is not stiff enough in the undeflected regions, the inking process may be compromised. The device designer needs to take these factors in consideration when manufacturing the device. FIGS. 3-8 show a process flow for an example device.

Figure 3:
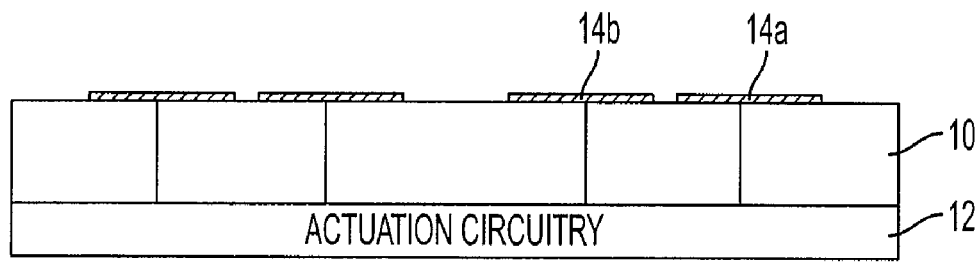
FIGS. 3-8 show embodiments of a method of manufacturing a printing surface.

In FIG. 3, electrodes such as 14a and 14b are deposited on a substrate 10. The substrate 10 may include actuation circuitry 12. The actuation circuitry activates the electrodes 14a and 14b to cause deflected ones of the pixel membranes to remain in the deflected position, as will be discussed in more detail later. Examples include a photoconductor film, which may be an organic photoconductor or an amorphous silicon or a selenium based photoconductor, allowing addressing of the pixel membranes with a scanning laser to charge the capacitor electrodes 14a and 14b, and a high voltage TFT active matrix backplane allowing matrix type addressing of the pixel membranes. The fabrication process may also employ curved and/or flexible substrates, allowing the realization of a roll based digital printing press.

Figure 4:
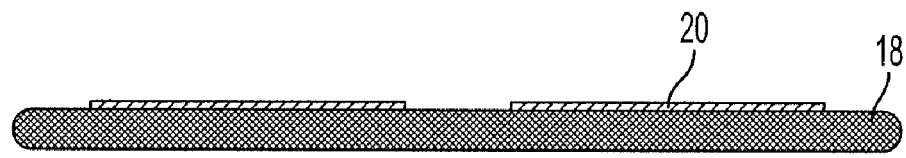
Figure 5:
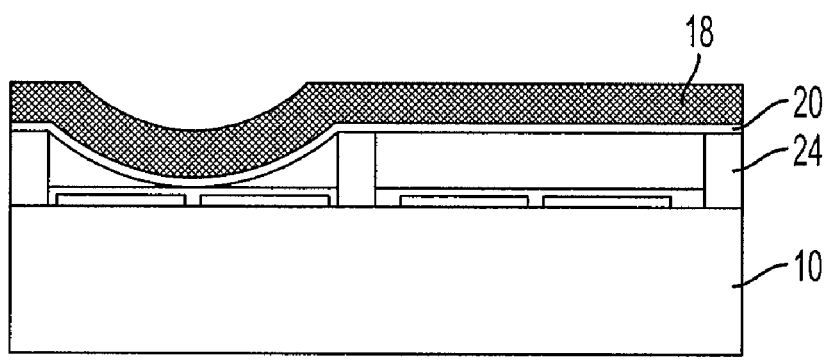

In FIG. 4 a thin sheet of elastomer receives a thin conducting film, typically metal. In one embodiment, the metal or conducting layer remains unpatterned as shown in FIG. 5. Since the elastomer layer 18 will strain and deform significantly, the metal conductor 20 needs to be stretchable. This approach has an advantage in that the elastomer 18 can attach to the substrate 10 and spacer layer 24 without alignment.

In the embodiment of FIG. 4, the process patterns the metal to leave only insulated metal electrodes aligned above the pixel well. The metal may be deposited for example by evaporation, sputter deposition, electroplating, electroless plating or a combination. Patterning may be performed by deposition through a shadow mask or by photolithography and etching methods. Also patterning by laser ablation is a possibility. The stiffness of the composite elastomer/metal membrane area can create a more sharply defined well when actuated, and most of the strain and deformation in the elastomer will be confined along the pixel membrane's edges where no metal is present. The patterned electrodes 20 are shown in FIG. 4. However, a large continuous stiff metal plate will increase the force required to deflect the membrane. It may be advantageous to pattern the metal electrode, such as in the shape of a serpentine.

Alternatively, the elastomer may have conductive properties. For example it may contain metallic carbon nanotubes, or metal particles such as silver nanoparticles, or graphite particles, as examples; carbon nanotubes are particularly useful because the required loading to achieve the percolation threshold for conductivity can be kept low and therefore the elasticity of the elastomer, such as PDMS, is minimally affected. Alternatively or the process may deposit, spin or bond an organic conductive material onto the elastomer. Another alternative would be to realize conductive areas in the elastomer by ion implantation. Note that the membrane material preferably comprises an elastomer because many applications require large relative deflections of the pixel membranes.

Figure 6:
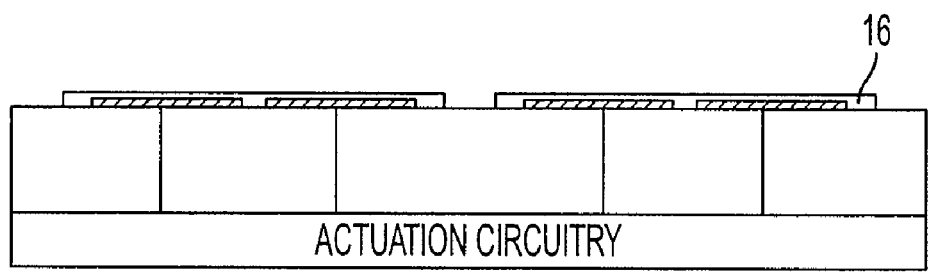
Figure 7:
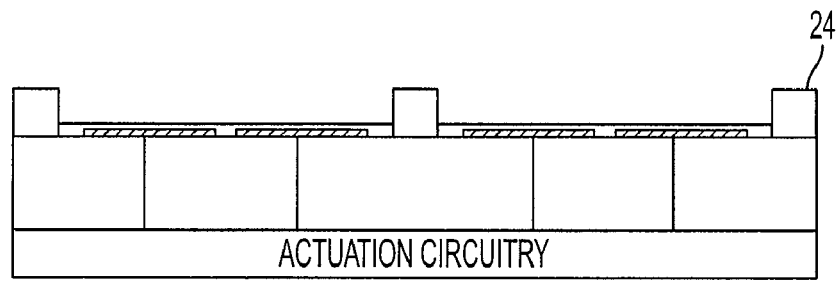
Figure 8:
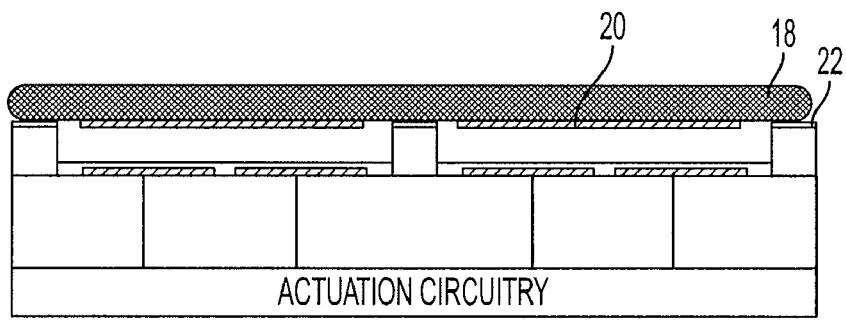

In FIG. 6, a dielectric 16 deposited on top of the substrate electrically insulates the electrodes. This dielectric layer may be either patterned or unpatterned. FIG. 6 shows the patterned dielectric. A spacer layer 24, such as a patterned SU-8 (MicroChem Corp.) layer of high aspect ratio, then resides on top of the substrate in FIG. 7. The thickness of the spacer layer determines the depth of the well in the printing surface. Typically, the spacer layer thickness may be from 1 to 50 microns. A bonding agent 22 then bonds the elastomer sheet onto the spacer on top of the substrate in FIG. 8. For example, the bonding agent may be roller-coated onto the top section of the walls of the spacer layer. The glue layer should be less than 5 microns thick, otherwise it might flow into the well. A membrane is then laminated on to the bonding agent. The laminated membrane should have slight tensile stress so that the undeflected pixel membranes do not buckle. Slight buckling may be acceptable if the printing plate operates with back-pressure as explained later. This bonding agent may be for instance a rubber adhesive such as 3M's Scotch-Weld.

Having discussed embodiments of manufacturing the printing surface, the discussion now turns to methods of forming a print image on the printing surface. It is hard to deflect the membranes with an electrostatic field only, particularly if the gap between the membrane and the substrate is large. High voltages would be required. Generally, the printing surface operates on a concept of forming a print image on the printing surface using an external mechanical force to deflect the membranes and subsequent electrostatic latching. When the pixel membrane to be inked is pushed into its 'down' state, a voltage between the bottom electrodes establishes a vertical electrostatic field between the bottom electrodes and the floating conductor on the membrane, resulting in an electrostatic force retaining the pixel membrane in its 'down' position. Alternatively, in the case of a single bottom electrode, a voltage is applied between the bottom electrode and the conductive layer of the elastomer membrane, causing an electrostatic force.). The selected voltage has to overcome the elastic restoring force of the membrane and should not exceed the breakdown field of the dielectric, as discussed previously. Various approaches may cause the initial actuation moving the membranes in the 'down' position.

Figure 9:
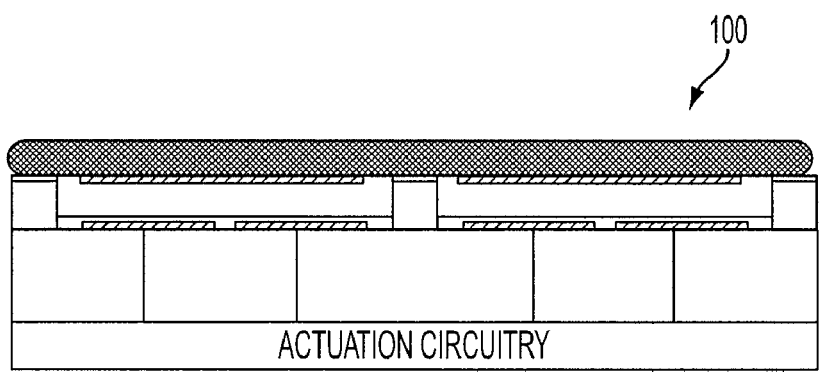
FIGS. 9-19 show embodiments of a method of printing using an electrostatically deformable printing plate.
Figure 10:
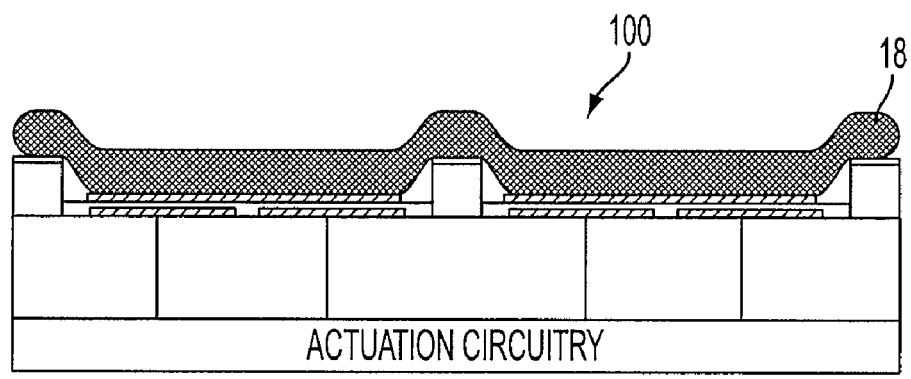

FIG. 9 shows a printing surface 100 in its 'original' state, a state in which no image exists on the surface. In FIG. 10, all of the pixel membranes have assumed their deflected positions due to the deflection of the membrane 18. The pixels membranes may assume this state in response to one of many methods of externally applied force that would cause them to move.

Figure 11:
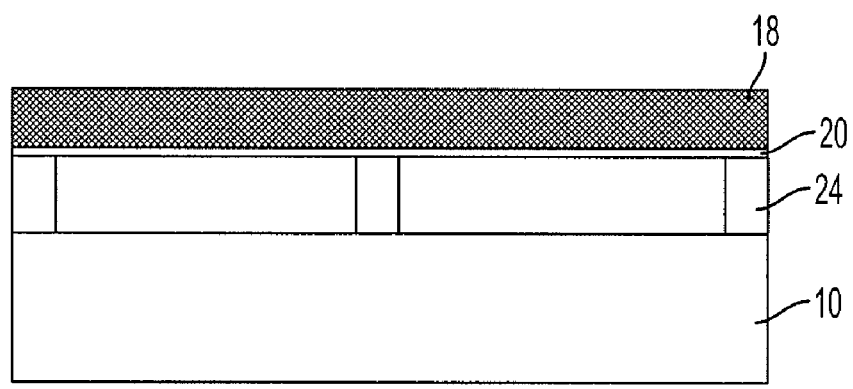
Figure 12:
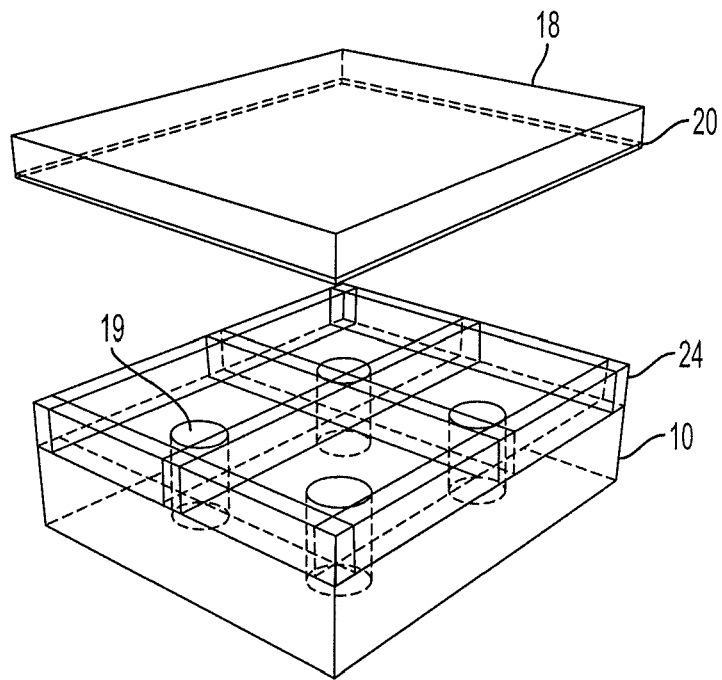
Figure 13:
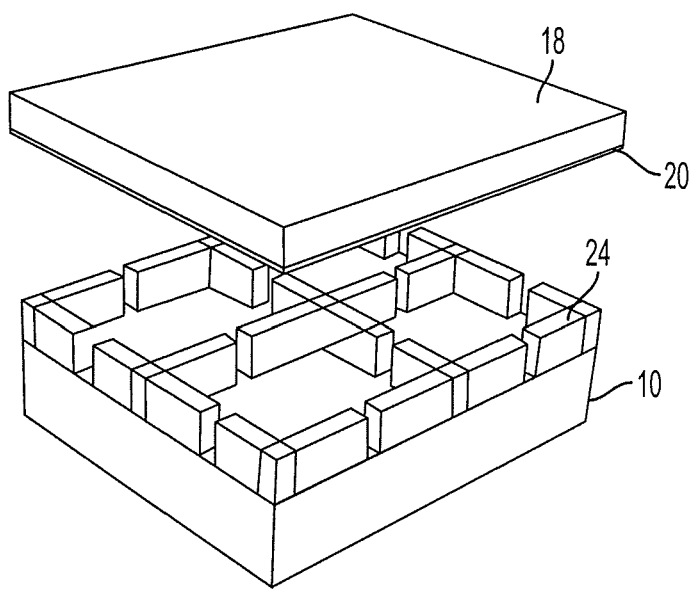

For example, application of a negative pressure (vacuum) to the cavities underneath the elastomer causes the membrane to deflect. This example may require a porous spacer layer, a porous substrate, ventilation holes in the substrate or a spacer layer pattern that does not result in sealing of the individual pixel membrane cavities. Examples of these are shown in FIGS. 11-13. A venting feature or a larger air reservoir may be required in any of these examples. Alternatively, one may rely on the compressibility of air in the small wells.

FIG. 11 shows an example of a porous spacer layer. The spacer layer 24 on substrate 10 may be comprised of a material having 'particles' that allow air to pass between them. In the case of SU-8 walls, a porous wall structure can be achieved by mixing the SU-8 with a second polymer to form an emulsion. After cross-linking of the SU-8 walls, the second polymer which does not cross-link is dissolved which results in SU-8 walls with voids.

FIG. 12 shows an example of ventilation holes through the substrate under each pixel membrane. The holes may be etched using reactive ion etching, wet chemical etching, laser-drilling or other commonly known micromachining methods. The holes would be arranged around the electrodes. Positive or negative pressure may be applied from the back side of the substrate 10. FIG. 13 shows an example of a patterned spacer layer that allows positive or negative pressure to be applied near the edges of the printing plate and propagated to the pixel membranes.

Figure 14:
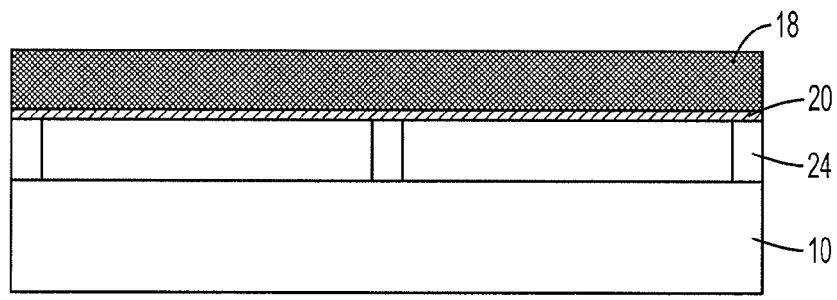

FIG. 14 shows an example of a porous substrate with a non-porous spacer layer. The areas of the substrate upon which would reside the electrodes would not be porous. The substrate 10 would be porous, and the spacer layer 24 would not. The substrate material can for instance be a porous sintered metal plate, such as the 'SIKA-FIL' material being distributed by GKN Sinter Metals Filters. This material also offers enough structural stability to enable the thin film processing required to create the electrodes and dielectric on its surface.

It must be noted that in FIGS. 11-14, the electrode would be that shown as the membrane electrode 20 discussed with regard to FIG. 5. However, these examples may have either the 'membrane' electrode or individually patterned electrodes. No limitation to either kind of electrode to any particular embodiment of the spacer layer or substrate is intended nor should be assumed.

Alternatively, all pixel membranes receive the voltage initially and then an external mechanical force pushed the membranes towards the substrate. In one example a drum, plate or curved plate forms a rotating surface and is rotated across the pixels to cause them to deflect. After the rotating surface has passed and moved all pixels in their latched positions, the voltage on those pixel membranes that are not to retain ink ('white' pixel membranes) is switched off, releasing them to their initial position. The surface of the drum may consist of a soft compliant material such as an elastomer or a polymer foam so that all pixel membranes are contacted.

Alternatively, extrusions that fit in the pixel membrane well elements and push down on them would exist on the drum. This may require alignment of the printing surface to the drum. Alternatively, the mechanical force may also originate from fluid pressure. Instead of air or gas as described below, a fluid such as water or a low viscosity oil may push onto the membranes, such as via fluid jets or a pressurized fluid chamber, and force them downwards. Moreover, the ink which is applied during the inking process may push the membranes downwards.

Another alternative involves the use of compressed air. Either the volume above the printing plate is pressurized or jets of compressed air would force the pixel membranes in their 'down' position. Yet another approach uses magnetic actuation. If the metal that is bonded or coated to the bottom surface of the elastomer is ferromagnetic, such as Ni or NiFe, applying a strong external magnetic field from the bottom of the printing plate substrate would pull down all pixel membranes into the 'down' position. The pixel membranes that are to retain ink ('black' pixel membranes) then electrostatically latch into the down position and the magnetic field switches off. An electromagnet the size of the printing surface can generate the external magnetic field or the field may be scanned across the array. One also could use a combination of mechanical and magnetic actuation. For example, the membranes could be pushed down by a mechanical force and the un-latched membranes could be pulled up by a magnetic field. In particular, during the inking process described later, if the blade or squeegee or anilox roller has magnetic properties, it would attract the un-latched membranes and improve the inking process by increasing the contact force.

In another variation, a large compressive stress built into the elastomer layer would form bistable buckled membranes. Application of negative pressure to the cavities underneath the pixel membranes pulls all membranes into their downward state. 'Black' pixel membranes electrostatically latch and then a positive pressure pushes all the 'white' pixel membranes into their upward state. This approach has the potential to improve or ease the ink doctor blading process as well as to create a more enhanced printing surface for flexography as will be discussed later.

Figure 15:
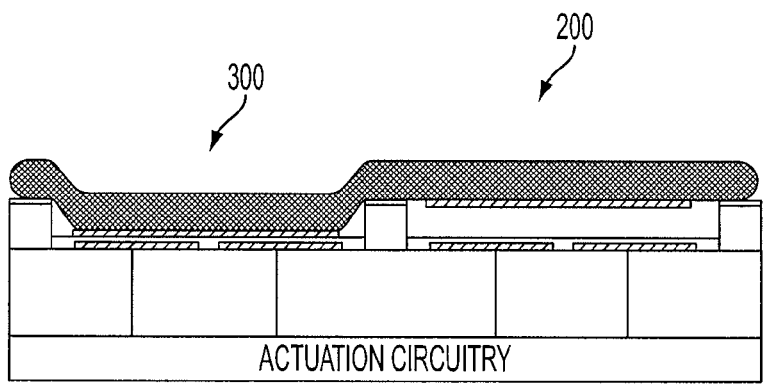

In FIG. 15, the 'white' pixel membrane 200 has returned to its nondeflected, nondeformed, or 'original' state. Generally, the pixel membranes that do not receive a latching voltage will return to their original state due to the elastic restoring force of the membrane. Alternatively, the pixel membranes may receive an external force, such as air or gas pressure from within the wells that cause them to return to their undeflected state. Another alternative may be application of a magnetic field on the top of the membrane. In this way the image data translates into a pattern of wells or pits on the printing surface. An alternative way of moving the membranes back up would apply positive pressure to the cavities in the substrate. This approach relies upon pixel membranes that do not seal. As mentioned earlier, there may need to be some leakage. The 'black' pixel membrane 300 remains deflected to receive ink.

Figure 16:
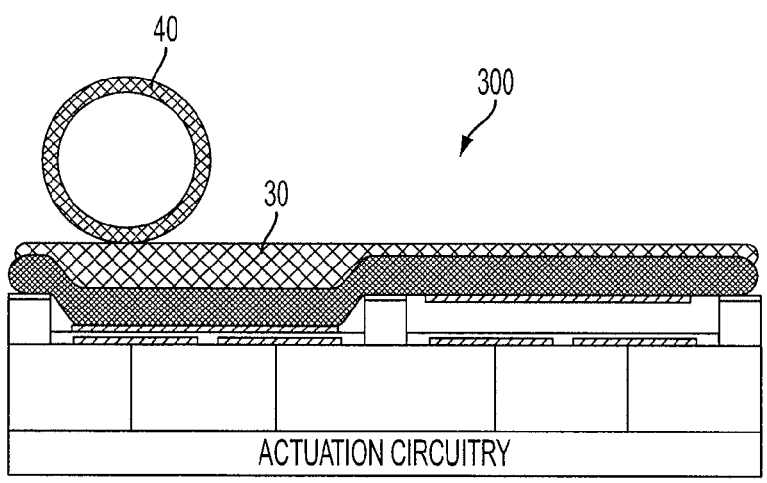

The ink may reach the deflected pixel membranes in several ways. Generally, some sort of applicator, such as the drum 40 shown in FIG. 16 applies ink to the printing surface. Where a pit or well exists, such as at pixel membrane 300, the ink will fill the well. A doctor blade or other removal apparatus such as a 'squeegee' removes the excess ink in FIG. 17. The blade 50 moves across the surface of the printing plate at a depth corresponding to the undeflected pixel membranes, such as 200, leaving ink in the wells formed by the pixel membranes, such as 300. It may be necessary to apply slight pressure from the back to prevent that the ink on the undeflected membrane sections is properly cleaned off. However, the pressure must be lower than the latching pressure of the deflected pixels. Alternatively, the ink is only applied to the raised structures, such as by an anilox roller. The lowered membranes remain without ink.

Figure 18:
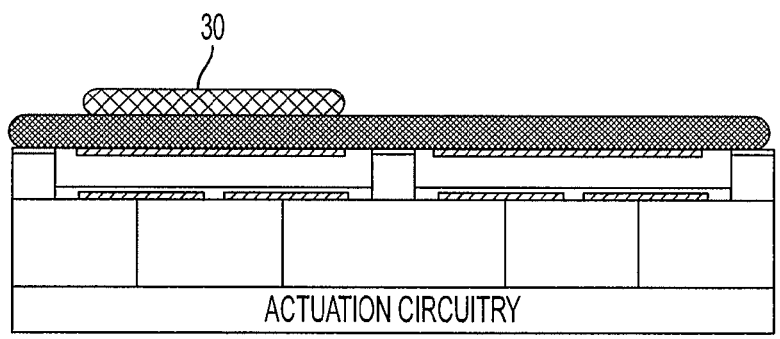
Figure 19:
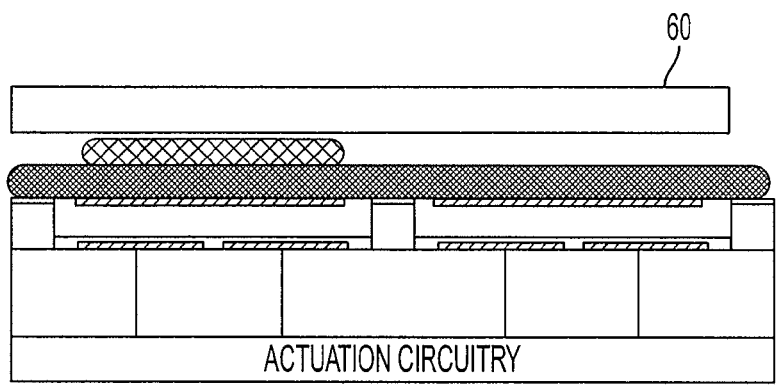

In a flexographic printing process, the deflected membranes return to their original state with the ink dot 30 as shown in FIG. 18 by subsequently switching off the latching voltage on all pixel membranes. As mentioned previously, use of a restoring force such as positive pressure or other impetus to return the membrane to the undeflected state may assist in the flexographic printing process. In this example, the printing surface contacts the printing substrate 60, such as paper, plastic, foil, transfer surface, etc., at FIG. 19 and the ink is transferred from the printing plate to the printing surface to form a pixel of the printed image.

Figure 17:
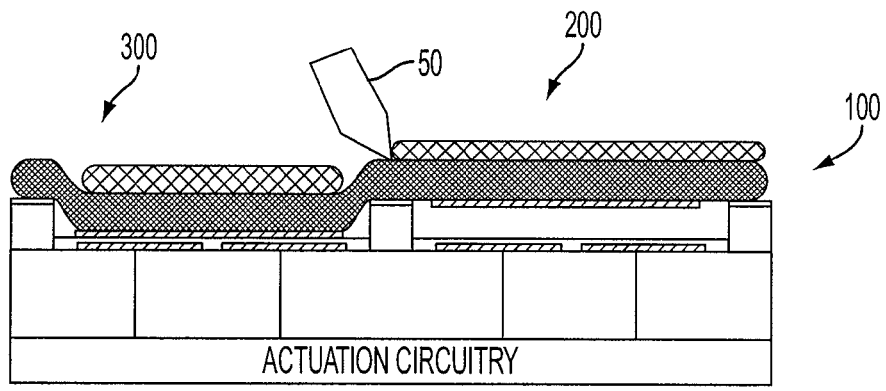

In a gravure printing process, the printing surface may contact the printing substrate at FIG. 17 after the doctor blade finished removing the excess ink. In this embodiment, the deflected state of the membranes may result in a higher contact pressure needed to transfer the ink to the printing substrate.

One advantage of this printing surface lies in its reusability. The printing surface in its current configuration can receive ink and transfer images to printing substrates just as any other flexographic or gravure plate. When the current print job completes and a new print job needs a new print image, the process can clean and then reconfigure the printing surface to form the new print image. Cleaning may involve wiping the squeegee/blade across the surface with undeflected membranes. This reduces the cost of the printing process as each new print job will not require a new printing plate, just a new image formed on the current printing surface.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A method of printing, comprising:
   moving an array of pixel membranes on a printing surface to a deflected position;
   causing selected ones of the pixel membranes to hold the deflected position while moving others of the pixel membranes to an undeflected position; and
   applying ink to the printing surface;
   moving the selected ones of the pixel membranes in the deflected position to an undeflected state forming an undeflected printing surface; and
   applying the undeflected printing surface to a printing substrate.

2. The method of claim 1, comprising removing excess ink from the printing surface such that ink remains in deflected portions of the printing surface corresponding to the selected ones of the pixel membranes in the deflected positions.

3. The method of claim 1, wherein moving the pixel membranes comprises applying one of applying an external mechanical force or an external magnetic field.

4. The method of claim 3, wherein the external mechanical force comprises one of fluid pressure, gas pressure, fluid pressure from the ink during the inking, or mechanical contact with a solid material.

5. The method of claim 3, wherein the external magnetic field comprises a magnetic force generated on a magnetic part located in one of in the membrane or on the membrane surface.

6. The method of claim 1, wherein causing selected ones comprises electrostatically latching the selected ones into the deflected position, and moving others comprises one of applying a positive pressure to the wells to move the others not electrostatically latched, allowing elastic force in the membranes to restore the others not electrostatically latched; or applying a magnetic field to a top of the membrane.

7. The method of claim 1, wherein applying ink to the printing surface comprises one of either applying ink into the selected ones of the pixel membranes holding the deflected position or applying ink to undeflected surfaces of the other pixel membranes.

* * * * *